(12) United States Patent
Bulatowicz

(10) Patent No.: US 8,138,760 B2
(45) Date of Patent: Mar. 20, 2012

(54) TEMPERATURE SYSTEM WITH MAGNETIC FIELD SUPPRESSION

(75) Inventor: Michael D. Bulatowicz, Canoga Park, CA (US)

(73) Assignee: Northrop Grumman Guidance and Electronics Company, Inc., Los Angeles, CA (US)

( * ) Notice: Subject to any disclaimer, the term of this patent is extended or adjusted under 35 U.S.C. 154(b) by 902 days.

(21) Appl. No.: 12/144,225

(22) Filed: Jun. 23, 2008

(65) Prior Publication Data

US 2009/0316753 A1 Dec. 24, 2009

(51) Int. Cl.
*G01V 3/00* (2006.01)

(52) U.S. Cl. .......................... 324/315; 324/319

(58) Field of Classification Search .......... 324/300–322; 600/407–435; 219/552, 544
See application file for complete search history.

(56) References Cited

U.S. PATENT DOCUMENTS

| | | | | |
|---|---|---|---|---|
| 5,379,231 A | * | 1/1995 | Pillage et al. | 703/14 |
| 5,814,792 A | * | 9/1998 | Wildi | 219/544 |
| 6,734,404 B2 | * | 5/2004 | Hays | 219/552 |
| 6,919,543 B2 | | 7/2005 | Abbott et al. | |
| 6,980,001 B2 | * | 12/2005 | Paley et al. | 324/318 |
| 7,218,104 B2 | | 5/2007 | Clarke et al. | |
| 2003/0178415 A1 | | 9/2003 | Hays | |
| 2005/0148864 A1 | * | 7/2005 | Slade et al. | 600/423 |
| 2009/0009156 A1 | * | 1/2009 | Duric | 324/202 |
| 2010/0181845 A1 | * | 7/2010 | Fiorello et al. | 307/104 |

FOREIGN PATENT DOCUMENTS

| | | |
|---|---|---|
| DE | 10 2004 058 588 A1 | 8/2005 |
| EP | 0 827 364 A2 | 3/1998 |
| JP | 2005 192825 A | 7/2005 |

OTHER PUBLICATIONS

Search Report for corresponding EP 09 16 2674, completed Sep. 15, 2009.

* cited by examiner

*Primary Examiner* — Brij Shrivastav
(74) *Attorney, Agent, or Firm* — Tarolli, Sundheim, Covell & Tummino LLP

(57) ABSTRACT

A temperature system is provided with magnetic field suppression. In one embodiment, the temperature system comprises a plurality of conductors patterned to conduct current in directions that generate $2^N$ multipole magnetic moments that interact to suppress the magnetic fields generated by the current conducting through the plurality of conductors, where N is an integer that is greater than one.

30 Claims, 7 Drawing Sheets

TEMPERATURE SYSTEM WITH MAGNETIC FIELD SUPPRESSION

TECHNICAL FIELD

The present invention relates to temperature systems and, more particularly, to a temperature system with magnetic field suppression.

BACKGROUND OF THE INVENTION

A broad range of technical fields involve electromagnetically sensitive temperature controlled environments. For Example, Nuclear Magnetic Resonance (NMR) is a technique for obtaining information about atoms and the molecules. NMR operates on atoms having nuclei in which at least one proton or neutron is unpaired in a temperature controlled environment. This imbalance causes these nuclei to spin on an axis like miniature tops and gives rise to a magnetic moment. When exposed to an external magnetic field, these spinning magnets attempt to align their axes along the lines of magnetic force. Therefore, NMR systems are sensitive to electromagnetic interference. In particular, gyroscopes employing NMR are highly sensitive to electromagnetic interference. Extraneous electromagnetic fields can often cause an NMR gyroscope to exceed its intersystem magnetic tolerance.

Possible sources of extraneous electromagnetic field are temperature devices, such as a heater, for directly heating the NMR cell and a temperature sensor for detecting the temperature of the NMR cell. Magnetic Resonance Imaging techniques are also highly sensitive to electromagnetic interference in a temperature controlled environment for similar reasons. Although these are merely exemplary, it is understood that electromagnetically sensitive temperature controlled environments are pervasive in various technical fields.

SUMMARY OF THE INVENTION

In accordance with one aspect of the present invention, a temperature system is provided. The temperature system comprises plurality of conductors patterned to conduct current in directions that generate $2^N$ multipole magnetic moments that interact to suppress the magnetic fields generated by the current conducting through the plurality of conductors, where N is an integer that is greater than one.

In accordance with another aspect of the present invention, a temperature system is provided. The temperature system comprises a first layer, a second layer underlying the first layer, a first plurality of conductors disposed on or in the first layer and patterned to conduct current in directions that generate $2^N$ multipole magnetic moments that interact to suppress the magnetic fields generated by the current conducting through the plurality of conductors, where N is an integer that is greater than one. The temperature system further comprises a second plurality of conductors disposed on or in the second substrate and patterned to conduct current in directions that generate $2^N$ multipole magnetic moments that suppress the magnetic fields generated by the current conducting through the second plurality of conductors. The first and second plurality of conductors are patterned to generate current in opposing directions in a dipole moment configuration that interact with one another to suppress magnetic fields generated by one another.

In accordance with yet a further aspect of the present invention, a temperature system is provided. The temperature system comprising a substrate, a first plurality of conductors disposed on or in the substrate and patterned to conduct current in directions that generate $2^N$ multipole magnetic moments that interact to suppress the magnetic fields generated by the current conducting through the plurality of conductors, where N is an integer that is greater than one. The temperature system further comprises a second plurality of conductors disposed on or in the first substrate and patterned to conduct current in directions that generate $2^N$ multipole magnetic moments that interact to suppress the magnetic fields generated by the current conducting through the second plurality of conductors. The first plurality of conductors form a first temperature device and the second plurality of conductors form a second temperature device.

In yet a further aspect of the invention, a temperature system is provided that comprises a first plurality of conductors patterned to conduct current in directions that generate $2^N$ multipole magnetic moments that interact to suppress the magnetic fields generated by the current conducting through the first plurality of conductors, where N is an integer that is greater than one. The system further comprises a second plurality of conductors patterned to conduct current in directions that generate $2^N$ multipole magnetic moments that suppress the magnetic fields generated by the current conducting through the second plurality of conductors, wherein the first and second plurality of conductors are configured in a multi-stacked configuration.

DETAILED DESCRIPTION OF INVENTION

Temperature systems are provided that are configured to suppress current induced magnetic fields. The temperature system can be a resistive heater for heating a portion of a magnetically sensitive system and/or a resistive temperature device (RTD) for determining a temperature of a portion of a magnetically sensitive system. In one aspect of the invention, a temperature system is provided that includes a plurality of conductors patterned to conduct current in directions that generate $2^N$ multipole magnetic moments that interact to suppress the magnetic fields generated by the current conducting through the plurality of conductors, where N is an integer that is greater than one. For example, the plurality of conductors can be configured in a quadrupole magnetic moment configuration, an octupole magnetic moment configuration, a sixteen pole magnetic moment configuration, a thirty-two pole magnetic moment configuration, a sixty-four pole magnetic moment configuration, etc. The plurality of conductors can be a plurality of conductive lines disposed on or in a substrate arranged in single layer or multilayer configuration, or a plurality of conductive wires wrapped around a structure, such as an insulating tube. The plurality of conductors can be arranged in a single or a multi-stacked planar and/or axial configuration. The multi-stack configuration can be configured in $2^N \times 2^M$ configuration where M is an integer equal to the number of stacks and N is equal the number of planar or axial poles in a set of conductors forming a given stack where N is not equal to M. Alternatively, the multi-stack configuration can be configured in a $2^N \times 2^N$ configuration (i.e., volumetric configuration) where the number of stacks of sets of conductors is equal to the number of planar or axial poles in a set of conductors forming a given stack.

Figure 1:
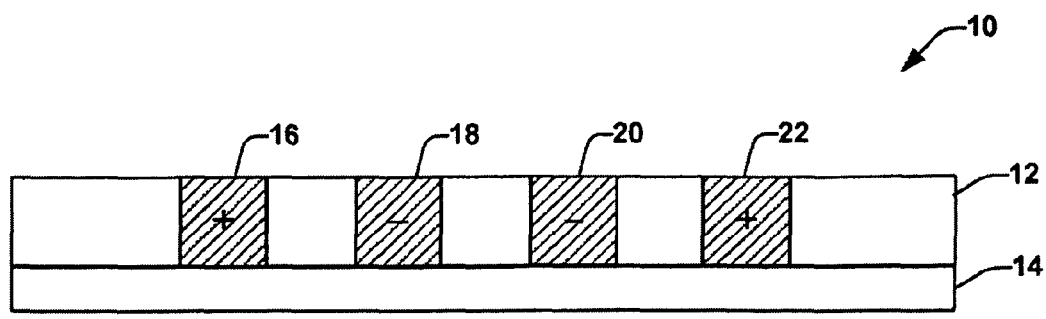
FIG. 1 illustrates a cross-sectional view of a portion of a temperature system in accordance with an aspect of the present invention.

FIG. 1 illustrates a cross-sectional view of a portion of a temperature system 10 in accordance with an aspect of the present invention. The portion of the temperature system 10 is configured in a quadrupole moment configuration. A plurality of conductors are disposed in a first substrate layer 12 overlying a second substrate layer 14. The plurality of conductors can be conductive lines formed from gold or some other conductive material and may be formed by etching trenches in the first substrate layer, depositing and polishing a gold layer over the first substrate layer 12 employing standard semiconductor processing techniques. The first substrate layer 12 can be formed of an insulator material such as Kapton or Silicon glass or some other insulator type material. The second substrate layer 14 is provided as a support layer and can be formed of an insulator material layer. The temperature system 10 can be configured as a resistive heater or a resistive temperature device depending on the voltage and current amplitudes applied to the conductors. For example, a voltage of 25 volts with a current of 10 ma can be employed to heat an environment employing a resistive heater, while a voltage of 1 mv with a current of 10 µamps can be employed for measuring a temperature employing a resistive temperature device.

As illustrated in FIG. 1, the plurality of conductors include a first conductor 16 that conducts current in a first direction indicated as a positive (+) current direction, a second conductor 18 that conducts current in a second direction indicated as a negative (−) current direction, a third conductor 20 that conducts current in the negative current direction and a fourth conductor 22 that conducts current in the positive current direction. The positive current direction is in an opposing direction as the negative current direction. The plurality of conductors are configured in a planar parallel relationship and provide a conduction pattern (+, −, −, +) that generates a positive pole moment generated by the first conductor 16 that is adjacent a negative pole moment generated by the second conductor 18 that is adjacent a negative pole moment generated by the third conductor 20 that is adjacent a positive pole moment generated by the fourth conductor 22. It is to be appreciated that a conduction pattern (−, +, +, −) could be configured with a negative pole moment adjacent, a positive pole moment, adjacent a positive pole moment, adjacent a negative pole moment. It is further appreciated that the term positive and negative is employed for explanation purposes since the direction of the current would be relative to the perspective of a viewer. For example, in a loop configuration a positive current direction may indicate a clockwise direction, while a negative current direction may indicate a counterclockwise direction. The plurality of conductors can be arranged in a plurality of different patterns such as in a zig-zag pattern or a series of winding loops that that are patterned to change directions to provide conductive current in opposing directions and to generate different polarity magnetic moments.

Figure 2:
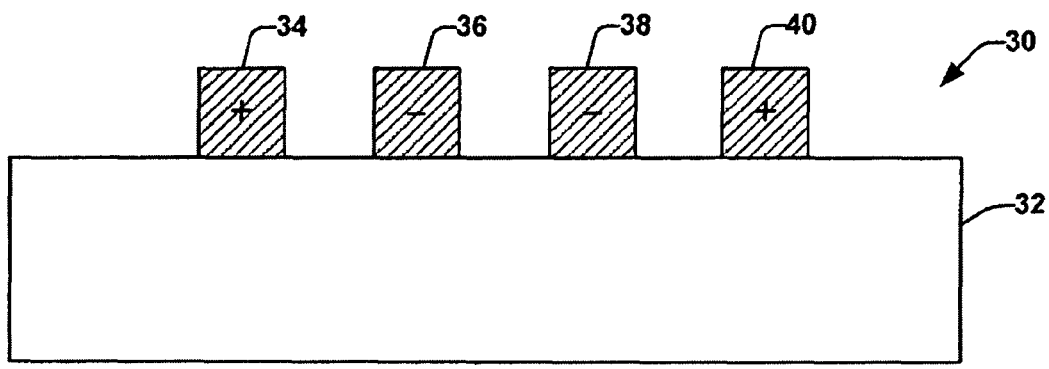
FIG. 2 illustrates a cross-sectional view of a portion of a temperature system in accordance with another aspect of the present invention.

FIG. 2 illustrates a schematic cross-sectional view of a portion of a temperature system 30 in accordance with an aspect of the present invention. The portion of the temperature system 30 is configured in a quadrupole moment configuration similar to temperature system 10 of FIG. 1. However, a plurality of conductors are disposed on a substrate layer 32. The plurality of conductors include a first conductor 34 that conducts current in a positive current direction that is adjacent a second conductor 36 that conducts current in a negative current direction that is adjacent a third conductor 38 that conducts current in the negative current direction that is adjacent a fourth conductor 40 that conducts current in the positive current direction. The plurality of conductors can be conductive lines formed from gold or some other conductive material and may be formed by depositing and etching a metal layer overlying the substrate layer 32 employing standard printed circuit board processing techniques. It is to be appreciated that the first substrate layer 12 of FIG. 1 and the substrate layer 32 of FIG. 2 can be a portion of a magnetically sensitive system, such as a wall or part of the magnetically sensitive system.

Figure 3:
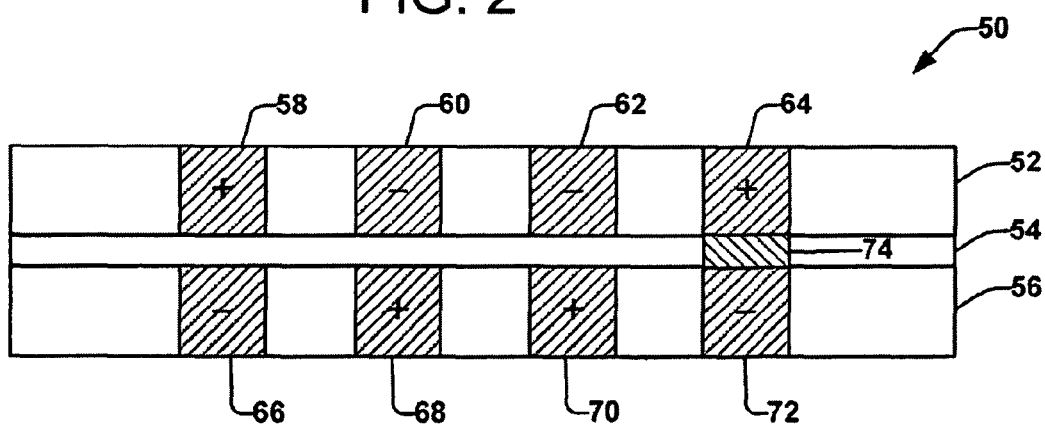
FIG. 3 illustrates a cross-sectional view of a portion of a temperature system with two layers configured in a dipole magnetic moment configuration in accordance with an aspect of the present invention.

FIG. 3 illustrates a schematic cross-sectional view of a temperature system 50 with two quadrupole magnetic moment layers configured in a dipole magnetic moment configuration in accordance with an aspect of the present invention. A first substrate layer 52 overlies a dielectric layer 54 and a second substrate layer 56 underlies the dielectric layer 54. The first substrate layer 52 includes a first plurality of conductors and the second substrate layer 56 includes a second plurality of conductors separated by the dielectric layer 54. The first substrate layer 52 overlays the second substrate layer 56 and the first and second plurality of conductors are patterned to generate current in opposing directions in a dipole moment configuration that interact with one another to suppress magnetic fields generated by one another. A contact 76 couples the first plurality of conductors with the second plurality of conductors to provide a closed loop temperature system.

As illustrated in FIG. 2, the first plurality of conductors comprise a first conductor 58 that conducts current in a positive current direction, a second conductor 60 that conducts current in a negative current direction, a third conductor 62 that conducts current in the negative current direction and a fourth conductor 64 that conducts current in the positive current direction. The plurality of conductors are configured in a planar parallel relationship and provide a conduction pattern that generates a positive pole moment generated by the first conductor 58 that is adjacent a negative pole moment generated by the second conductor 60 that is adjacent a negative pole moment generated by the third conductor 62 that is adjacent a positive pole moment generated by the fourth conductor 64.

The second plurality of conductors comprise a fifth conductor 66 that conducts current in the negative current direction, a sixth conductor 68 that conducts current in the positive current direction, a seventh conductor 70 that conducts current in the positive current direction and an eighth conductor 72 that conducts current in the negative current direction. The second plurality of conductors are configured in a planar parallel relationship and provide a conduction pattern that generates a negative pole moment generated by the fifth conductor 66 that is adjacent a positive pole moment generated by the sixth conductor 68 that is adjacent a positive pole moment generated by the seventh conductor 70 that is adjacent a negative pole moment generated by the eighth conductor 72. As illustrated in FIG. 3, conductors generating positive pole moments in one substrate layer are aligned in a juxtaposed relationship with conductors generating negative pole moments in the other substrate in a dipole moment configuration. In this configuration, magnetic fields are suppressed in respective substrate layers 52 and 56 by the quadrupole magnetic moment configuration of each of the substrate layers 52 and 56 and magnetic fields are suppressed between each of the substrate layers 52 and 56 by the dipole magnetic moment configuration between each of the substrate layers 52 and 56.

Figure 4:
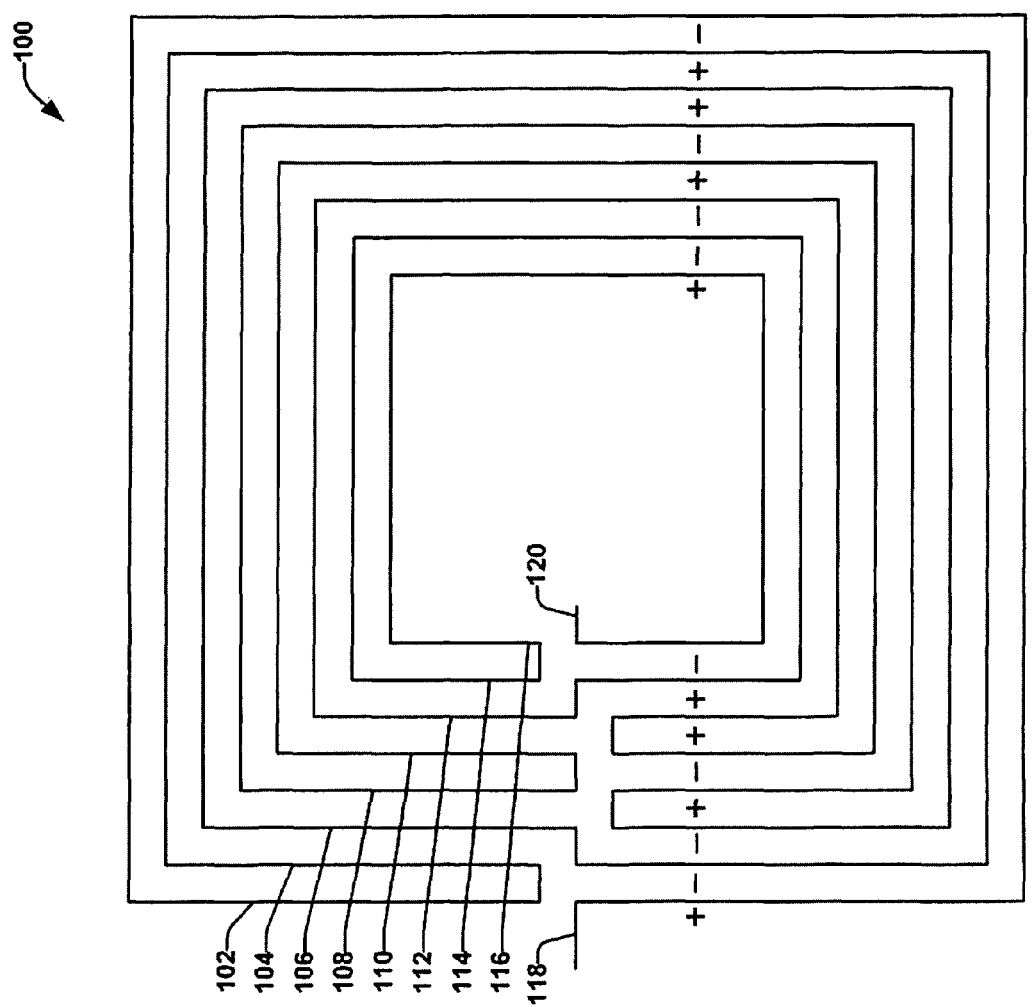
FIG. 4 illustrates a plan view of a temperature system having an octupole moment configuration in accordance with an aspect of the present invention.

FIG. 4 illustrates a plan view of a portion of a temperature system 100 having an octupole magnetic moment configuration in accordance with an aspect of the present invention. The temperature system includes eight conductors arranged in a series of eight continuous winding loops that are patterned to change directions to provide conductive current in opposing directions and to generate different polarity magnetic moments. The plurality of conductors include a first conductor 102 that conducts current in a positive current direction, a second conductor 104 that conducts current in a negative current direction, a third conductor 106 that conducts current in the negative current direction, and a fourth conductor 108 that conducts current in the positive current direction. The plurality of conductors further includes a fifth conductor 110 that conducts current in the negative direction, a sixth conductor 112 that conducts current in the positive direction, a seventh conductor 114 that conducts current in the positive direction, and an eighth conductor 116 that conducts current in the negative direction. It is to be appreciated that that the plurality of conductors can be disposed on or in a substrate layer.

The plurality of conductors are configured in a planar parallel relationship along the series of winding loops and provide a conduction pattern (+, −, −, +, −, +, +, −) that generates a positive pole moment generated by the first conductor 102 that is adjacent a negative pole moment generated by the second conductor 104 that is adjacent a negative pole moment generated by the third conductor 106 that is adjacent a positive pole moment generated by the fourth conductor 108 that is adjacent a negative pole moment generated by the fifth conductor 110 that is adjacent a positive pole moment generated by the sixth conductor 112 that is adjacent a positive pole moment generated by the seventh conductor 114 that is adjacent a negative pole moment generated by the eighth conductor 116. Contacts 118 and 120 are provided to couple the plurality of conductors to an electrical stimulus (i.e., voltage/current source) to provide a closed loop temperature system.

Figure 5:
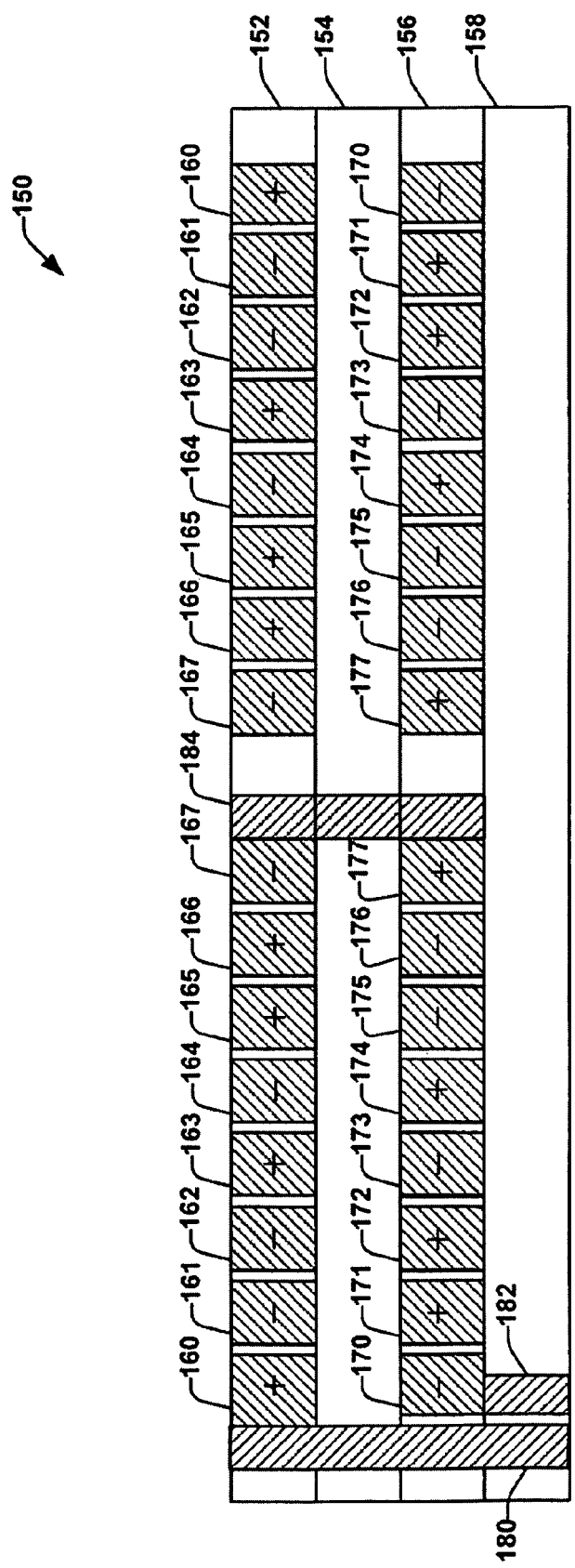
FIG. 5 illustrates a cross-sectional view of portion of a temperature system having two octupole magnetic moment layers configured in a dipole magnetic moment configuration in accordance with an aspect of the present invention.

FIG. 5 illustrates a cross-sectional view of a portion of a temperature system 150 with two octupole magnetic moment layers configured in a dipole magnetic moment configuration in accordance with an aspect of the present invention. A first substrate layer 152 overlies a first dielectric layer 154 and a second substrate layer 156 underlies the first dielectric layer 154. The first substrate layer 152 includes a first set of winding loops and the second substrate layer 156 includes a second set of winding loops separated by the dielectric layer 154. The first substrate layer 152 overlays the second substrate layer 156 and the first and second set of winding loops are patterned to generate current in opposing directions in a dipole moment configuration that interact with one another to suppress magnetic fields generated by one another. The second substrate layer 156 overlays a second dielectric layer 158. Contacts 180 and 182 are disposed in the second dielectric layer 158. Contact 180 provides electrical stimulus inputs (i.e., voltage/current) to the first set of winding loops, and contact 182 provides electrical stimulus inputs (i.e., voltage/current) to the second set of winding loops. Contact 184 couples the first set of winding loops with the second set of winding loops to provide a closed loop temperature system.

The first substrate layer 152 includes a first set of conductors arranged in a series of eight continuous generally rectangular winding loops. The generally rectangular winding loops are illustrated in the cross-sectional view of FIG. 5 as a first set of winding loops 160-167. The first set of winding loops 160-167 are patterned to change direction to provide conductive current in opposing directions and to generate an octupole magnetic moment that suppresses magnetic fields generated by current conducting through the first set of winding loops 160-167.

The second substrate layer 156 includes a second set of conductors arranged in a series of eight continuous generally rectangular winding loops. The generally rectangular winding loops are illustrated in the cross-sectional view of FIG. 5 as a second set of winding loops 170-177. The second set of winding loops 170-177 are patterned to change direction to provide conductive current in opposing directions and to generate an octupole magnetic moment that suppresses magnetic fields generated by current conducting through the second set of winding loops 170-177.

As illustrated in FIG. 5, winding loops generating positive pole moments in one substrate layer are aligned in a juxtaposed relationship with winding loops generating negative pole moments in the other substrate in a dipole moment configuration. In this configuration, magnetic fields are suppressed in respective substrate layers 152 and 156 by the octupole magnetic moment configuration of each substrate layer and magnetic fields are suppressed between each substrate layer 152 and 156 by the dipole magnetic moment configuration between each substrate layer.

Figure 6:
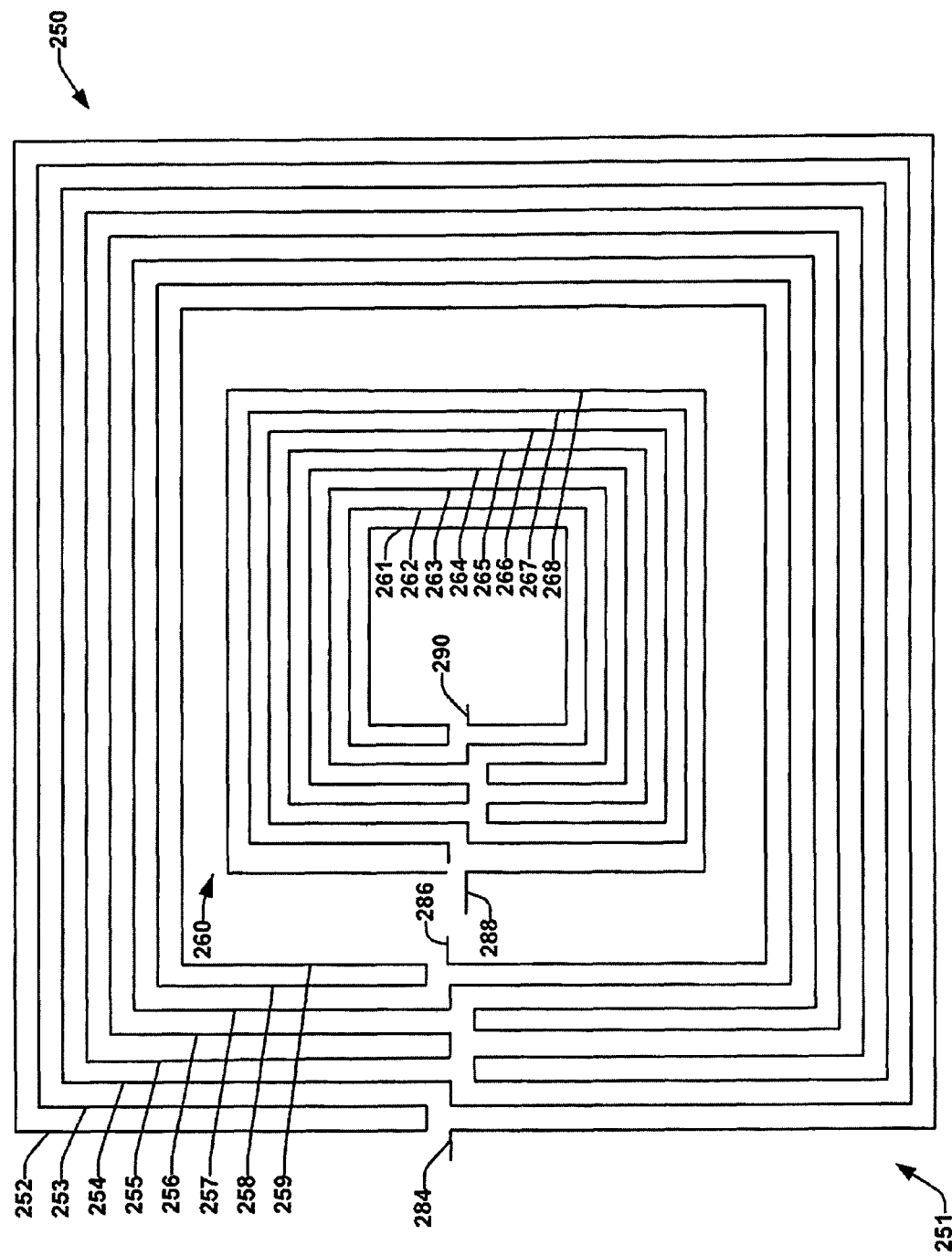
FIG. 6 illustrates a plan view of a temperature system having a first and a second heating device in accordance with an aspect of the present invention.

FIG. 6 illustrates a plan view of a temperature system 250 having a first and a second temperature device in accordance with an aspect of the present invention. A first temperature device 251 comprises a first set of eight conductors 252-259 arranged in a series of eight continuous generally rectangular winding loops that are patterned to change directions to provide conductive current in opposing directions and to generate an octupole magnetic moment that suppresses magnetic fields generated by current conducting through the first set of eight conductors 252-259. The second temperature device 267 is disposed inside the first temperature device 251. The second temperature device 267 comprises a second set of eight conductors 261-268 arranged in a series of eight continuous winding loops that are patterned to change directions to provide conductive current in opposing directions and to generate an octupole magnetic moment that suppresses magnetic fields generated by current conducting through the second set of eight conductors 261-268. Contacts 284, and 286 provide electrical stimulus inputs (i.e., voltage/current) to the first temperature device 251 and contacts, 288, and 290 provide electrical stimulus inputs (i.e., voltage/current) to the second temperature device 260. The first temperature device 251 can be, for example, a resistive heater and the second temperature device 260 can be, for example, a resistive temperature detector. The first and second temperature devices 251 and 260 can reside on or in a same substrate.

Figure 7:
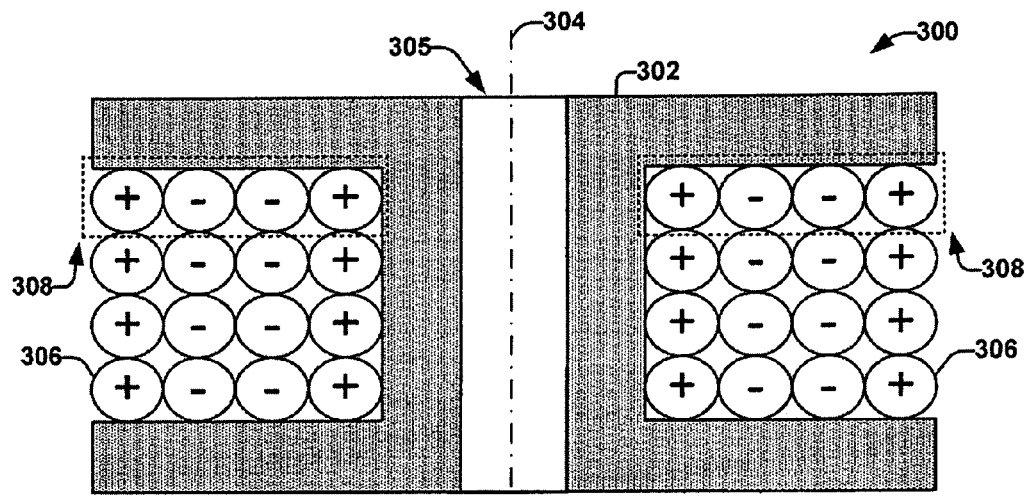
FIG. 7 illustrates a cross-sectional view of another temperature system that employs conductors wrapped around a structure in accordance with an aspect of the present invention.

FIG. 7 illustrates a cross-sectional view of another temperature system 300 that employs conductors 306 wrapped around a structure 302 in accordance with an aspect of the present invention. The structure 302 can be, for example, an insulator tube that surrounds a central opening 305 about a central axis 304 and the conductors 306 can be a plurality of conductive wires. The plurality of conductive wires can be wrapped around an inner portion of the tube in a multi-stack configuration. A given conductor 306 conducts current in either a positive current direction (e.g., clockwise) to generate a positive pole moment or a negative current direction (e.g., counterclockwise) to generate a negative pole moment, such that the conductors change wrapping directions to change pole polarities. The plurality of conductors 306 are patterned to conduct current in directions that generate $2^N$ multipole magnetic moments and configured in a stacked arrangement with the $2^N$ stacks of conductors in a volumetric configuration, where N is an integer greater than one. Each stack is configured in planar quadrupole configuration 308 illustrated with dashed lines, such that the quadrupole (+, −, −, +) extends along the plane of the stack perpendicular to the central axis 304 of the tube 306.

Figure 8:
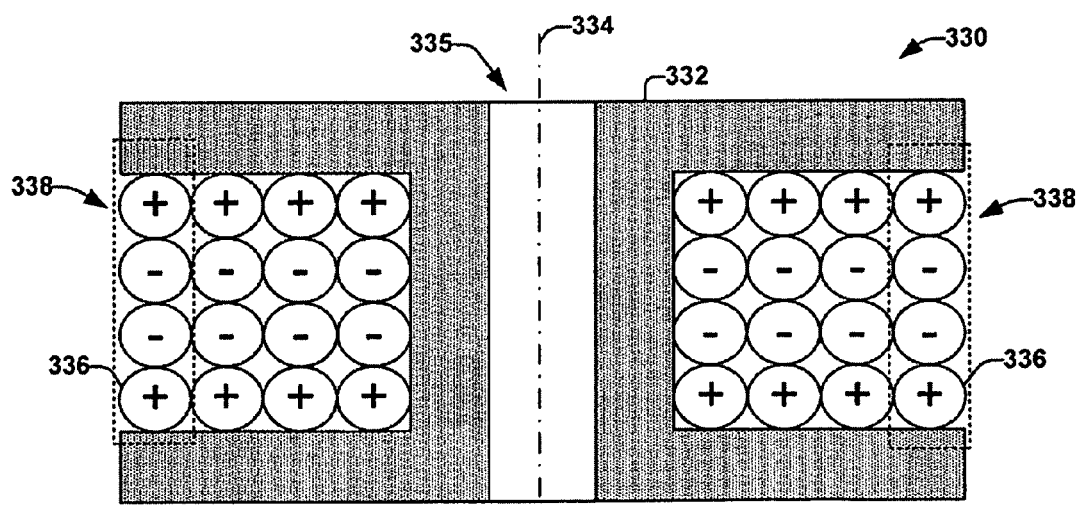
FIG. 8 illustrates a cross-sectional view of yet another temperature system that employs conductors wrapped around a structure in accordance with an aspect of the present invention.

FIG. 8 illustrates a cross-sectional view of yet another temperature system 330 that employs conductors 336 wrapped around a structure 332 in accordance with an aspect of the present invention. The structure 332 can be, for example, an insulator tube that surrounds a central opening 335 about a central axis 334 and the conductors 336 can be a plurality of conductive wires. The plurality of conductive wires can be wrapped around an inner portion of the tube in a multi-stack configuration. A given conductor 336 conducts current in either a positive current direction (e.g., clockwise) to generate a positive pole moment or a negative current direction (e.g., counterclockwise) to generate a negative pole moment, such that the conductors change wrapping directions to change pole polarities. The plurality of conductors 336 are patterned to conduct current in directions that generate $2^N$ multipole magnetic moments and configured in a stacked arrangement with the $2^N$ stacks of conductive wires in a volumetric configuration, where N is an integer greater than one. Each stack is configured in an axial quadrupole configuration 338 as indicated by dashed lines, such that the quadrupole (+, −, −, +) extends axially in parallel with the central axis 334 of the tube.

Figure 9:
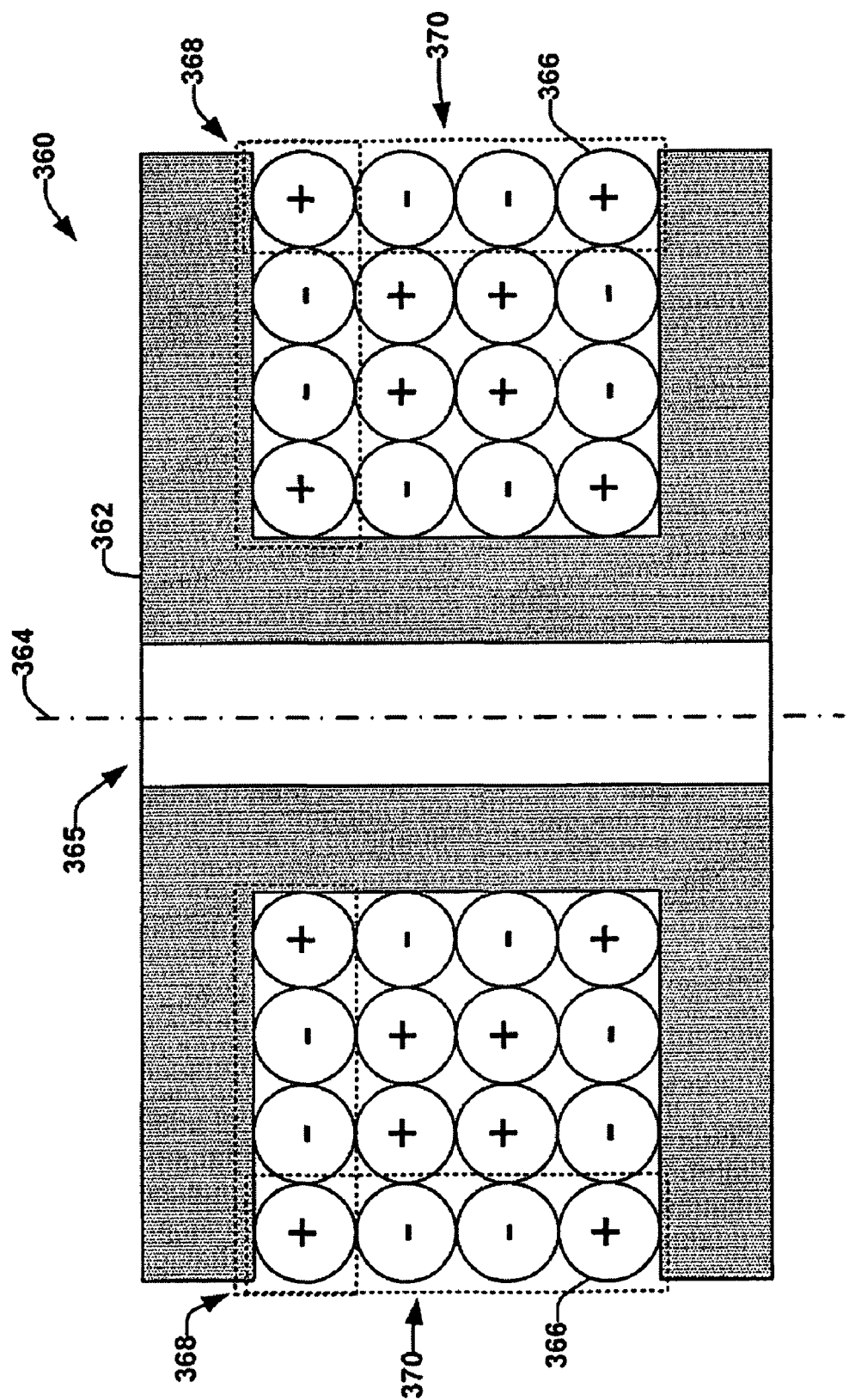
FIG. 9 illustrates a cross-sectional view of yet a further temperature system that employs conductors wrapped around a structure in accordance with an aspect of the present invention.

FIG. 9 illustrates a cross-sectional view of yet a further temperature system 360 that employs conductors 366 wrapped around a structure 362 in accordance with an aspect of the present invention. The structure 362 can be, for example, an insulator tube that surrounds a central opening 364 about a central axis 364 and the conductors 366 can be a plurality of conductive wires. The plurality of conductive wires can be wrapped around an inner portion of the tube in a multi-stack configuration. A given conductor 366 conducts current in either a positive current direction (e.g., clockwise) to generate a positive pole moment or a negative current direction (e.g., counterclockwise) to generate a negative pole moment, such that the conductors 366 change wrapping directions to change pole polarities. The plurality of conductors 366 are patterned to conduct current in directions that generate $2^N$ multipole magnetic moments and configured in a stacked arrangement with the $2^N$ stacks of conductive wires in a volumetric configuration, where N is an integer greater than one. The stacks are configured in both a planar quadrupole configuration 368 as indicated by dashed lines and an axial quadrupole configuration 370 also indicated by dashed lines, such that quadrupoles (+, −, −, +) extends both planar perpendicular to the central axis 364 of the tube and axially in parallel with the central axis 364 of the tube.

Figure 10:
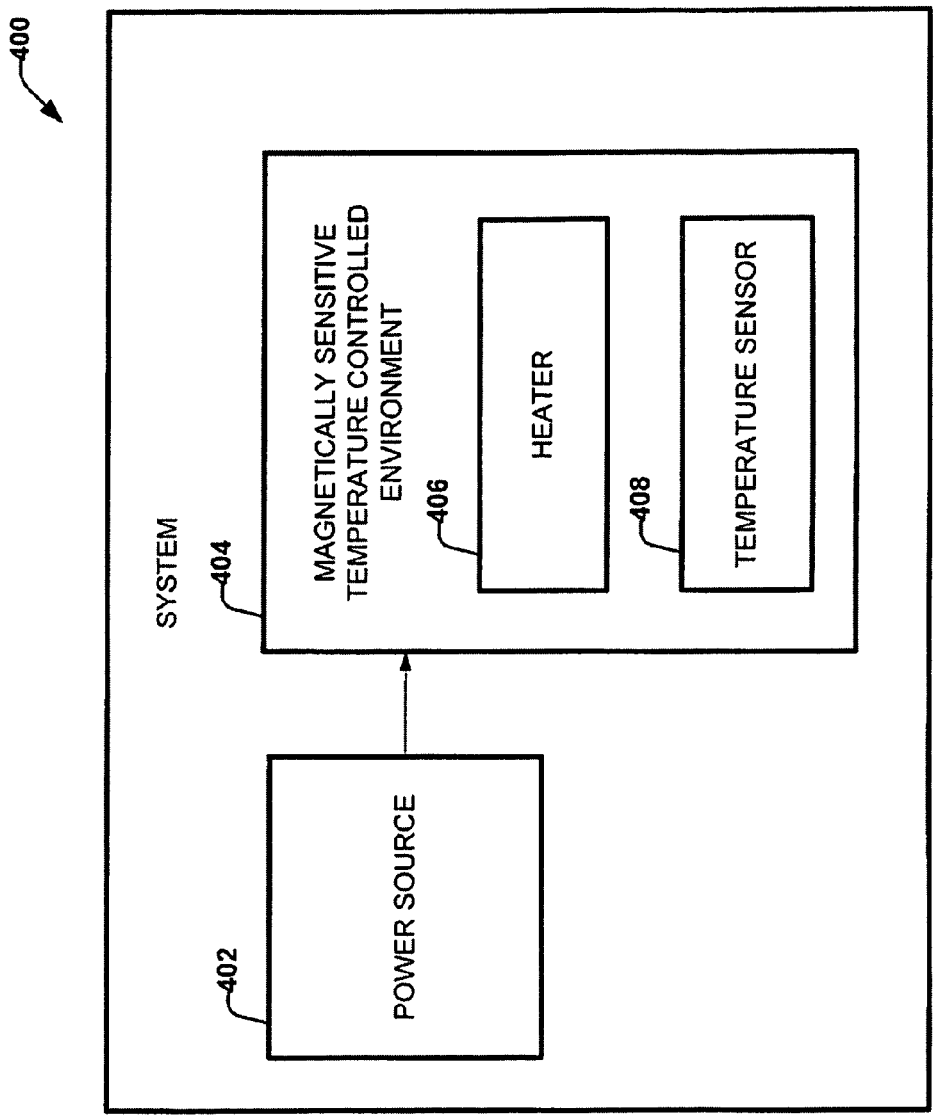
FIG. 10 illustrates a block diagram of a magnetically sensitive system with a temperature controlled environment in accordance with an aspect of the present invention.

FIG. 10 illustrates a block diagram of a system with a magnetically sensitive temperature controlled environment in accordance with an aspect of the present invention. The system 400 powers the magnetically sensitive temperature controlled environment 404 with a power source controller 402. The temperature of the temperature controlled environment 304 is heated by a resistive heater 406. The resistive heater 406 can be formed from a plurality of conductors that are patterned to conduct current in directions that generate $2^N$ multipole magnetic moments that interact to suppress the magnetic fields generated by the current conducting through the plurality of conductors, where N is an integer that is greater than one. The temperature of the magnetically sensitive temperature controlled environment 404 is determined by a resistance temperature sensor 408. The resistance temperature sensor 408 can also be formed from plurality of conductors that are patterned to conduct current in directions that generate $2^N$ multipole magnetic moments that interact to suppress the magnetic fields generated by the current conducting through the plurality of conductors, where N is an integer that is greater than one. The power source controller receives temperature measurements from the resistance temperature sensor 408 and controls the amount of power to the resistance heater 406 to maintain a desired temperature in the temperature controlled environment. The magnetically sensitive system 400 can be for example, a NMR gyroscope or a MRI.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A system comprising:
a plurality of conductors patterned to conduct current in directions that generate $2^N$ multipole magnetic moments that interact to suppress the magnetic fields generated by the current conducting through the plurality of conductors, where N is an integer that is greater than one and at least two adjacent conductors of the plurality of conductors are patterned to conduct current in a same direction;
wherein the plurality of conductors are configured in one of a parallel and an axial relationship to provide a conduction pattern that generates a first pole moment with a first polarity that is adjacent a second pole moment with a second polarity that is adjacent a third pole moment with the second polarity that is adjacent a fourth pole moment with the first polarity, wherein the first and second polarities are opposite polarities.

2. The system of claim 1, wherein the plurality of conductors are arranged in a series of winding loops that are patterned to change directions to provide conductive current in opposing directions and to generate different polarity magnetic moments.

3. The system of claim 1, wherein the plurality of conductors comprise a plurality of conductive wires that are wrapped around a structure.

4. The system of claim 1, wherein the plurality of conductive wires are a first plurality of conductive wires and further comprising at least one additional plurality of conductive wires patterned to conduct current in directions that generate $2^N$ multipole magnetic moments, such that the first plurality of conductive wires and the at least one additional plurality of conductive wires are configured in a stacked arrangement in at least one of a planar and axial configuration.

5. The system of claim 1, wherein the plurality of conductors comprise a plurality of conductive lines disposed in or on a substrate.

6. The system of claim 1, wherein the first polarity is positive polarity and the second polarity is a negative polarity.

7. The system of claim 1, further comprising a first substrate and the plurality of conductors are a first plurality of conductors and further comprising a second substrate and a second plurality of conductors disposed on or in the second substrate and patterned to conduct current in directions that generate $2^N$ multipole magnetic moments that interact to suppress the magnetic fields generated by the current conducting through the second plurality of conductors, where the first substrate overlays the second substrate and the first and second plurality of conductors are patterned to generate current in opposing directions in a dipole moment configuration that interact with one another to suppress magnetic fields generated by one another.

8. The system of claim 7, wherein the first substrate is a first layer and the second substrate is a second layer and further comprising a third layer that is a contact layer, such that a first contact extends from the contact layer to the first plurality of conductors, a second contact extends from the first plurality of conductors to the second plurality of conductors and a third contact extends from the second plurality of conductors to the contact layer to provide a closed loop temperature system.

9. The system of claim 1, wherein the plurality of conductors are a first plurality of conductors and further comprising a second plurality of conductors disposed on or in a first substrate and patterned to conduct current in directions that generate $2^N$ multipole magnetic moments that interact to suppress the magnetic fields generated by the current conducting through the second plurality of conductors, where the first plurality of conductors form a first temperature device and the second plurality of conductors form a second temperature device.

10. The system of claim 8, wherein the first temperature device is a resistive heater device and the second temperature device is a resistive temperature detector.

11. The system of claim 1, wherein the system is one of a resistive heater device and a resistive temperature detector.

12. A nuclear magnetic resonance gyroscope comprising the system of claim 1.

13. A magnetic resonance imager comprising the system of claim 1.

14. A temperature system comprising:
a first layer;
a second layer underlying the first layer;
a first plurality of conductors disposed on or in the first layer and patterned to conduct current in directions that generate $2^N$ multipole magnetic moments that interact to suppress the magnetic fields generated by the current conducting through the plurality of conductors, where N is an integer that is greater than one; and
a second plurality of conductors electrically isolated from the first plurality of conductors, the second plurality of conductors being disposed on or in the second layer and patterned to conduct current in directions that generate $2^N$ multipole magnetic moments that suppress the magnetic fields generated by the current conducting through the second plurality of conductors, the first and second plurality of conductors are patterned to generate current in opposing directions in a dipole moment configuration that interact with one another to suppress magnetic fields generated by one another.

15. The system of claim 14, wherein the first and second plurality of conductors are arranged in a series of winding loops that change direction to provide conductive current in opposing directions and to generate different polarity magnetic moments.

16. The system of claim 14, further comprising a third layer that is a contact layer, such that a first contact extends from the contact layer to the first plurality of conductors, a second contact extends from the first plurality of conductors to the second plurality of conductors and a third contact extends from the second plurality of conductors to the contact layer to provide a closed loop temperature system.

17. The system of claim 14, further comprising:
a third plurality of conductors disposed on or in the first layer and patterned to conduct current in directions that generate $2^N$ multipole magnetic moments that interact to suppress the magnetic fields generated by the current conducting through the third plurality of conductors; and
a fourth plurality of conductors disposed on or in the second layer and patterned to conduct current in directions that generate $2^N$ multipole magnetic moments that interact to suppress the magnetic fields generated by the current conducting through the fourth plurality of conductors, the third and fourth plurality of conductors are patterned to generate current in opposing directions in a dipole moment configuration to suppress magnetic fields generated from one another.

18. A nuclear magnetic resonance gyroscope comprising the system of claim 14.

19. A magnetic resonance imager comprising the system of claim 14.

20. A temperature system comprising:
a substrate;
a first plurality of conductors disposed on or in the substrate and patterned to conduct current in directions that generate $2^N$ multipole magnetic moments that interact to suppress the magnetic fields generated by the current conducting through the plurality of conductors, where N is an integer that is greater than one; and
a second plurality of conductors disposed on or in the substrate and patterned to conduct current in directions that generate $2^N$ multipole magnetic moments that interact to suppress the magnetic fields generated by the current conducting through the second plurality of conductors, where the first plurality of conductors form a first temperature device and the second plurality of conductors form a second temperature device.

21. The system of claim 20, wherein the first and second plurality of conductors are arranged in a series of generally rectangular shaped winding loops that change direction to provide conductive current in opposing directions and to generate different polarity magnetic poles.

22. The system of claim 20, wherein the substrate is a first substrate and further comprising:
a second substrate underlying the first substrate;
a third plurality of conductors disposed on or in the second substrate and patterned to conduct current in directions that generate $2^N$ multipole magnetic moments that interact to suppress the magnetic fields generated by the current conducting through the third plurality of conductors, where the first and third plurality of conductors are patterned to generate current in opposing directions in a dipole configuration to suppress magnetic fields generated from one another; and a fourth plurality of conductors disposed on or in the second substrate and patterned to conduct current in directions that generate $2^N$ multipole magnetic moments that interact to suppress the magnetic fields generated by the current conducting through the fourth plurality of conductors, where the second and fourth plurality of conductors are patterned to generate current in opposing directions in a dipole moment configuration that interact with one another to suppress magnetic fields generated by one another.

23. The system of claim 20, wherein the first temperature device is a resistive heater device and the second temperature device is a resistive temperature detector.

24. A nuclear magnetic resonance gyroscope comprising the system of claim 20.

25. A magnetic resonance imager comprising the system of claim 20.

26. A temperature system comprising:
a first plurality of conductors patterned to conduct current in directions that generate 2N multipole magnetic moments that interact to suppress the magnetic fields generated by the current conducting through the plurality of conductors, where N is an integer that is greater than one; and a second plurality of conductors patterned to conduct current in directions that generate 2N multipole magnetic moments that suppress the magnetic fields generated by the current conducting through the second plurality of conductors, wherein the first and second plurality of conductors are configured in a multi-stacked configuration.

27. The system of claim 26, further comprising at least two additional plurality of conductors patterned to conduct current in directions that generate 2N multipole magnetic moments and wherein the system is configured in a stacked arrangement with the 2N stacks of conductors in a volumetric configuration where N is also an integer equal to the number of stacks and N is also equal the number of planar and/or axial poles in a set of conductors forming a given stack.

28. The system of claim 27, wherein each set of the plurality of conductors comprise a plurality of conductive lines disposed in or on a substrate.

29. The system of claim 27, wherein each set of the plurality of conductors comprise a plurality of conductive wires wrapped around a structure.

30. The system of claim 26, wherein the system is a multi-stacked configuration of conductors configured in 2N×2M configuration where M is an integer equal to the number of stacks and N is equal the number of planar and/or axial poles in a set of conductors forming a given stack where N is not equal to M.

* * * * *